United States Patent
Ho et al.

(10) Patent No.: US 6,808,643 B2
(45) Date of Patent: Oct. 26, 2004

(54) HYBRID INTERCONNECT SUBSTRATE AND METHOD OF MANUFACTURE THEREOF

(75) Inventors: Kwun-Yao Ho, Taipei (TW); Moriss Kung, Taipei (TW)

(73) Assignee: Via Technologies, Inc., Taipei (TW)

( * ) Notice: Subject to any disclaimer, the term of this patent is extended or adjusted under 35 U.S.C. 154(b) by 145 days.

(21) Appl. No.: 10/336,674

(22) Filed: Jan. 6, 2003

(65) Prior Publication Data

US 2004/0074865 A1 Apr. 22, 2004

(30) Foreign Application Priority Data

Oct. 17, 2002 (TW) ........................................ 91123873 A

(51) Int. Cl.⁷ .......................... H01B 13/00; H01L 29/00
(52) U.S. Cl. .......................... 216/13; 438/106; 438/108; 438/118; 29/831
(58) Field of Search .................... 216/13; 438/106–118; 29/830–831

(56) References Cited

U.S. PATENT DOCUMENTS

| | | | | |
|---|---|---|---|---|
| 6,114,239 A | * | 9/2000 | Lake et al. | 438/653 |
| 6,441,473 B1 | * | 8/2002 | Deshmukh | 257/669 |
| 6,462,423 B1 | * | 10/2002 | Akram et al. | 257/778 |

* cited by examiner

Primary Examiner—Nadine G. Norton
Assistant Examiner—Shamim Ahmed
(74) Attorney, Agent, or Firm—Rosenberg, Klein & Lee

(57) ABSTRACT

A hybrid interconnect substrate and method of manufacture thereof are disclosed. The hybrid interconnect substrate is formed by bonding a carrier substrate to a multi-level interconnect structure formed on a handle substrate. The multi-level interconnect structure is formed by deposition, photolithography and etching processes used in integrated circuit processes or in TFT-LCD technology.

21 Claims, 4 Drawing Sheets

HYBRID INTERCONNECT SUBSTRATE AND METHOD OF MANUFACTURE THEREOF

BACKGROUND OF THE INVENTION

1. Field of the Invention

The present invention relates to a hybrid interconnect substrate and method of manufacture thereof, and more particularly to a hybrid substrate with high density interconnects and method of manufacture thereof.

2. Description of the Related Art

Conventional substrates used in flip chip package processes include buildup structures and laminate structures. FIG. 1 shows a flip chip package structure. A high density interconnect (HDI) structure 102 is formed on a base material 100 as shown in FIG. 1. The base material 100 and the high density interconnect structure 102 constitute the substrate of a flip chip package structure. The high density interconnect structure bonds to a "flipped" chip 112 through the soldering between bumps 110 and bonding pads 108 so as to form a flip chip package structure. The high density interconnect structure 102 comprises a dielectric part 104 and a circuit 106. The high density interconnect structure 102 is basically multi-level and it can be formed by building up or laminating.

Flip chip substrates which have high density interconnect structures directly formed level by level on base materials are buildup substrates. The structure of the buildup substrate is formed by directly forming a high density interconnect structure (HDI) on a carrier substrate/core substrate which is a printed circuit board (PCB). By directly forming a high density interconnect structure on a carrier substrate/core substrate, the HDI-on-PCB substrate has advantages of accurate buildup line/space and thickness control, accurate impedance control and embedding passive components directly. The structure of a buildup substrate can be also formed by directly forming a high density interconnect structure (HDI) on the both sides of a carrier substrate/core substrate. However, the HDI-on-PCB substrate has disadvantages of substrate dimension deviation in each buildup process, causing high cost and low yield. Moreover, since the HDI is directly formed on PCB carrier substrate/core substrate, the size of the build substrate is limited to the maximum size of the PCB carrier substrate/core substrate which is 610×610 millimeters. Furthermore, the limitation of the exist HDI substrate equipment has disadvantages for new developments like design rule reduction, high yield, embedded passive components and so on.

In view of the drawbacks mentioned with the prior art processes and structures of flip chip substrates, there is a continued need to develop new and improved processes and structures that overcome the disadvantages associated with prior art processes and structures.

SUMMARY OF THE INVENTION

It is therefore an object of the invention to provide a hybrid substrate with high density interconnects having superior production yield by separately forming low-density substrates and high-density circuits.

It is another object of this invention to provide a hybrid substrate with high density interconnects having low production cost by using well developed thin-film transistor liquid-crystal display (TFT-LCD) integrated circuit process techniques and large size substrates.

It is another object of this invention to provide a hybrid substrate with high density interconnects having excellent impedance control.

It is another object of this invention to provide a hybrid substrate with high density interconnects having embedded passive components.

To achieve these objects, and in accordance with the purpose of the invention, the invention provides a method for forming a interconnect substrate, the method comprises the following steps. A transparent handle substrate is firstly provided. Then an adhesive photo-decomposing dielectric layer is formed on said handle substrate. Next, a multi-level interconnect structure is formed on said adhesive photo-decomposing dielectric layer. Then an adhesive bonding film is formed on said multi-level interconnect structure. Next, the adhesive bonding film is patterned to expose bonding pads of said multi-level interconnect structure. The multi-level interconnect structure is then bonded with a carrier substrate by soldering said bonding pads to conductors on said carrier substrate. The photo-decomposing dielectric layer is then decomposed. Finally, the handle substrate and the photo-decomposing dielectric layer are removed.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow and structures. The present invention can be practiced in conjunction with various fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1:
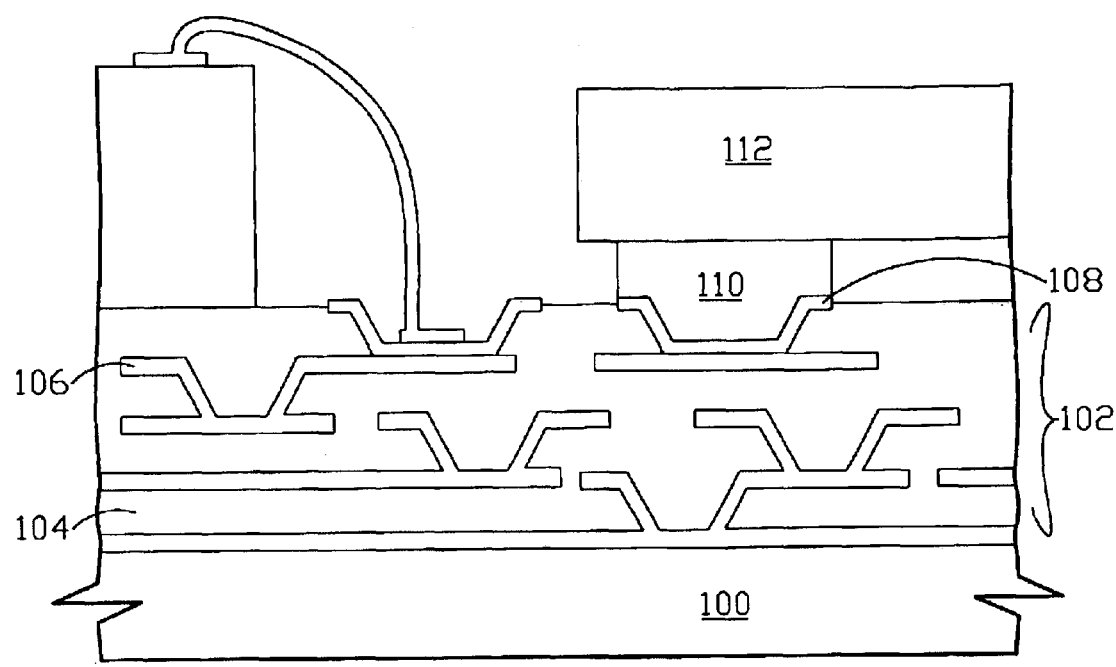
FIG. 1 shows a conventional flip chip package structure.
Figure 2A:
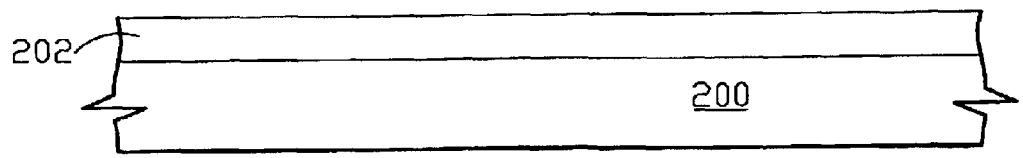
FIG. 2A shows a handle substrate having a base layer thereon.

Referring to FIG. 2A, a handle substrate 200 having a base layer 202 thereon is shown. The handle substrate 200 comprises a transparent flat plate. More particularly, the handle substrate 200 preferably comprises a quartz substrate or a glass substrate with a unit size larger than 610×611 millimeters. The glass substrates used in thin-film transistor liquid-crystal display (TFT-LCD) processes are preferred examples of the handle substrate 200. The base layer 202 is preferably adhesive and comprises an adhesive polymer layer and a releasable film. Releasable films are dielectric films commonly used in modern package processes. Furthermore, the base layer 202 can be decomposed by using ultra-violet (UV) or laser beam exposure or thermal dosing and then can be easily removed.

Figure 2B:
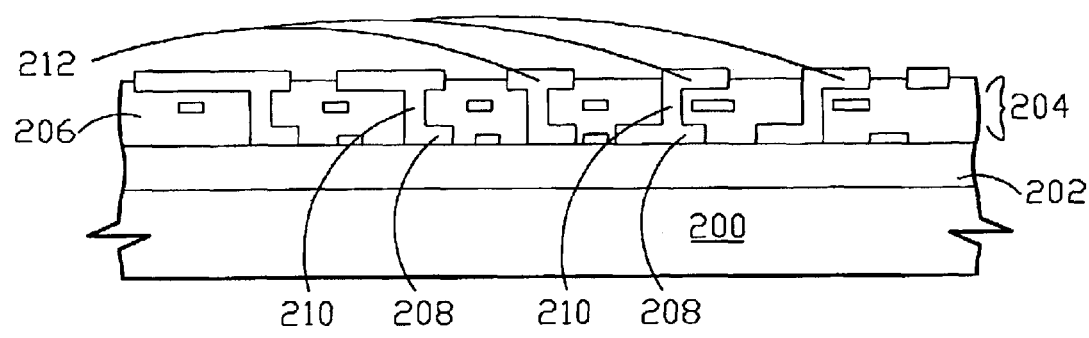
FIG. 2B shows a result of forming a multi-level interconnect structure 204 on the base layer.

Referring to FIG. 2B, a multi-level interconnect structure 204 is formed on the base layer 202. The multi-level interconnect structure 204 comprises a dielectric part 206 and a conductive part. The conductive part comprises bonding pads 208 and 212, and vias 210. It is noted that the multi-level interconnect structure 204 shown in FIG. 2B is in simplified form since the multi-level interconnect structure 204 should has multiple levels. The multi-level interconnect structure 204 is preferably formed by using TFT-LCD process equipments. The multi-level interconnect structure 204 is formed by semiconductor processes of micron or sub-micron dimension. The semiconductor processes comprises deposition, photolithography and etching processes. Moreover, passive components can also be embedded in the multi-level interconnect structure 204.

Figure 2C:
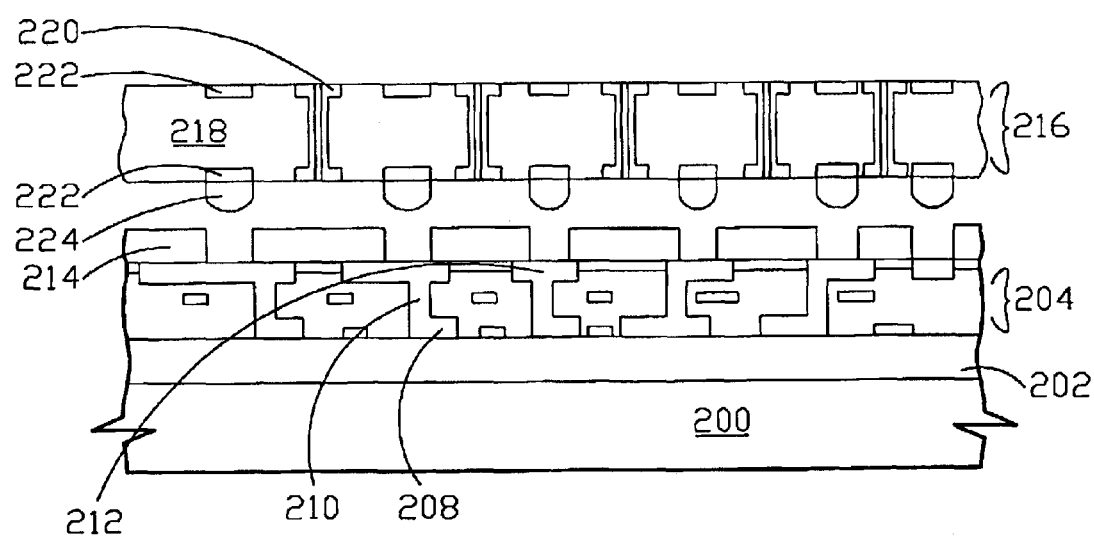
FIG. 2C shows a chip carrier substrate and a result of forming and patterning a bonding film on the multi-level interconnect structure to expose the bonding pads.

Referring to FIG. 2C, a bonding film 214 is formed on the multi-level interconnect structure 204 and is patterned to expose the bonding pads 212. The bonding film 214 is a sticky and adhesive dielectric film as well as a semi-cured film. FIG. 2C also shows a chip carrier substrate 216. The chip carrier substrate 216 comprises a printed circuit board 218 such as a low cost and cheap ball grid array like (BGA) substrate. The chip carrier substrate 216 has a printed circuit. The printed circuit comprises bonding pads 222 and vias 220. As shown in FIG. 2C, conductors 224 are formed on the bonding pads 222. The conductors 224 may comprise solder pastes, metal surface coating or metal bumps. The solder pastes can be formed by squeegee printing, and the metal surface coating and metal bumps can be formed by plating. The bonding film 214 can also be formed on the chip carrier substrate 216 and expose the bonding pads 222 instead of the multi-level interconnect structure 204.

Figure 2D:
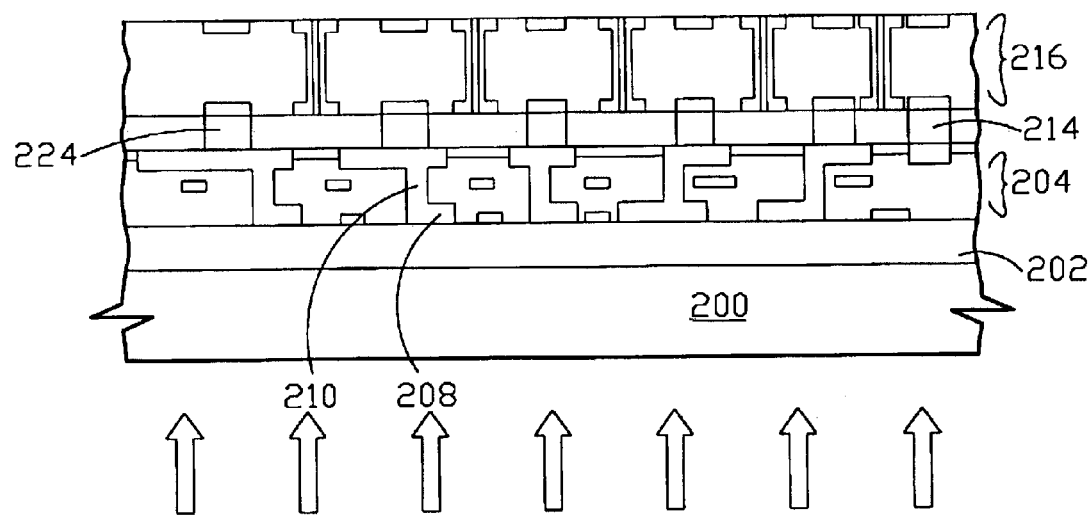
FIG. 2D shows a result of bonding the chip carrier substrate with the multi-level interconnect structure.

Referring to FIG. 2D, the chip carrier substrate 216 is bonded with the multi-level interconnect structure 204 through the bonding between the bonding pads 212 and the conductors 224 as well as the stickiness of the bonding film 214. Then the base layer 202 is decomposed by exposing to an ultra-violet beam or a laser beam. Light beams transmit to the base layer 202 through the transparent handle substrate 200 and provide the base layer 202 with heat doses.

Figure 2E:
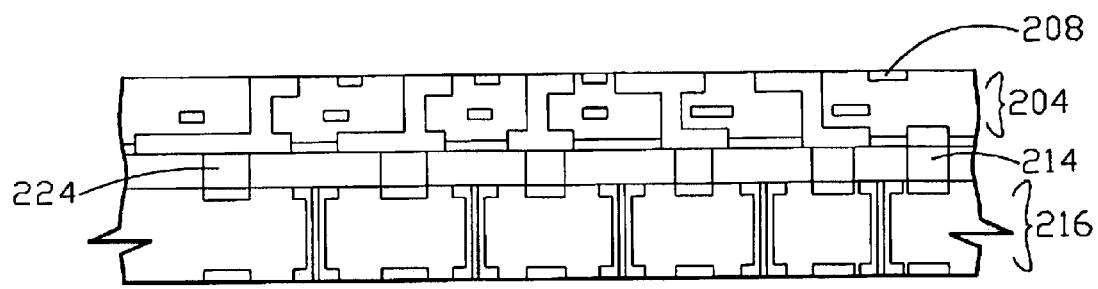
FIG. 2E shows a result of removing the handle substrate and the base layer and forming the hybrid interconnect substrate of this invention.
Figure 2F:
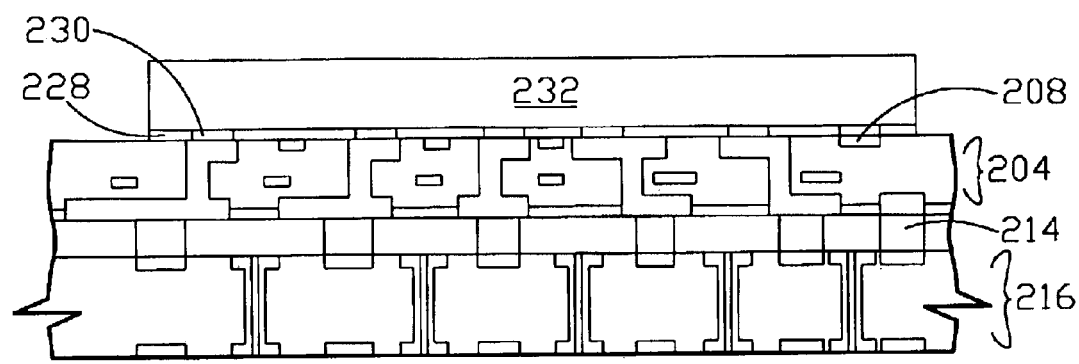
FIG. 2F shows the result of bonding a semiconductor chip to the hybrid interconnect substrate of this invention shown in FIG. 2E.

Referring to FIG. 2E, the transparent handle substrate 200 and the base layer 202 are removed, and the hybrid interconnect substrate of this invention is formed. The decomposed base layer 202 is removed by stripping or etching processes. FIG. 2F shows the result of bonding the hybrid interconnect substrate of this invention shown in FIG. 2E to a semiconductor chip 232. The hybrid interconnect substrate and the semiconductor chip 232 are bonded to form a flip chip package structure through the solder bonding of the bonding pads 208 and solder bumps 230 and the fixing of a dielectric material 228. The dielectric material 228 comprises an underfill or a molding compound.

The invention provides a hybrid interconnect substrate with high density interconnects. By using micron/sub-micron integrated circuit processes and large size quartz/glass substrates, high-density fine circuits are firstly formed on the quartz/glass substrates and then are transferred onto a low cost non-buildup substrate. The cost of the hybrid interconnect substrate is lower than conventional buildup substrate since well developed techniques and large size panel/handle substrate are used in this invention instead of directly forming buildup fine patterns on conventional core substrates with limited panel size and production yield. The invention also provides better production yield than conventional buildup processes by separately forming low density substrates/chip carrier substrates and high density circuits rather than directly forming fine patterns on core substrates. Directly forming fine patterns on core substrates always induces dimension variations of core substrates during multi-layer buildup processes. The invention can provide better impedance control since high accuracy and density interconnect technologies used to form fine and accurate conducting width and thickness, and dielectric layer thickness are utilized. Moreover, embedded passive components can be formed in high density interconnect structures so as to provide flip chip package structures with better electrical performance. Furthermore, since already existed integrated circuit (IC)/TFT-LCD technologies are used, many dielectric and conductive materials used in IC/TFT-LCD processes can be applied in the processes of the high density interconnect structures thereby better properties can be provided. Also, embedded passive components can be easily applied to the high density interconnect layers by this IC/TFT-LCD technology.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A method for forming an interconnect substrate, said method comprising:

providing a transparent handle substrate;

forming a adhesive photo-decomposing dielectric layer on said handle substrate;

forming a multi-level interconnect structure having a plurality of bonding pads thereon on said adhesive photo-decomposing dielectric layer;

applying an adhesive bonding film on said multi-level interconnect structure;

patterning said adhesive bonding film to expose said bonding pads of said multi-level interconnect structure;

providing a carrier substrate having a plurality of conductors thereon;

bonding said multi-level interconnect structure with said carrier substrate by soldering said bonding pads to said conductors on said carrier substrate;

decomposing said photo-decomposing dielectric layer;

removing said handle substrate; and removing said photo-decomposing dielectric layer.

2. The method according to claim 1, wherein said handle substrate is selected from a group consisting of quartz substrate and glass substrate.

3. The method according to claim 1, wherein said adhesive photo-decomposing dielectric layer comprises a release film.

4. The method according to claim 1, wherein said adhesive bonding film comprises a semi-cured film.

5. The method according to claim 1, wherein said carrier substrate comprises a printed circuit board.

6. The method according to claim 1, wherein said conductors are selected from a group consisting of solder pastes, metal bumps and metal surface coating.

7. The method according to claim 1, wherein said photo-decomposing dielectric layer is decomposed by a ultra-violet light.

8. The method according to claim 1, wherein said photo-decomposing dielectric layer is decomposed by laser.

9. The method according to claim 1, wherein said photo-decomposing dielectric layer is removed by etching.

10. The method according to claim 1, wherein said multi-level interconnect structure has at least one embedded passive component.

11. A method for forming an interconnect substrate, said method comprising:

providing a transparent glass substrate;

forming an adhesive photo-decomposing dielectric layer on said glass substrate;

forming a multi-level interconnect structure having a plurality of bonding pads thereon on said adhesive photo-decomposing dielectric layer;

providing a carrier substrate having a plurality of conductors thereon;

applying a adhesive bonding film on said carrier substrate;

patterning said adhesive bonding film to expose said conductors on said carrier substrate;

bonding said multi-level interconnect structure with said carrier substrate by soldering said bonding pads of said multi-level interconnect structure to said conductors on said carrier substrate;

decomposing said photo-decomposing dielectric layer;

removing said glass substrate; and removing said photo-decomposing dielectric layer.

12. The method according to claim 11, wherein said adhesive photo-decomposing dielectric layer comprises a release film.

13. The method according to claim 11, wherein said adhesive bonding film comprises a semi-cured film.

14. The method according to claim 11, wherein said carrier substrate comprises a printed circuit board.

15. The method according to claim 11, wherein said conductors comprise solder pastes.

16. The method according to claim 11, wherein said conductors comprise metal bumps.

17. The method according to claim 11, wherein said conductors comprise metal surface coating.

18. The method according to claim 11, wherein said photo-decomposing dielectric layer is decomposed by a ultra-violet light.

19. The method according to claim 11, wherein said photo-decomposing dielectric layer is decomposed by laser.

20. The method according to claim 11, wherein said photo-decomposing dielectric layer is removed by etching.

21. The method according to claim 11, wherein said multi-level interconnect structure has at least one embedded passive component.

* * * * *